(12) United States Patent
Kitamura et al.

(10) Patent No.: US 6,587,009 B2
(45) Date of Patent: Jul. 1, 2003

(54) VIBRATING PIECE, VIBRATOR, OSCILLATOR, AND ELECTRONIC EQUIPMENT

(75) Inventors: Fumitaka Kitamura, Suwa (JP); Junichiro Sakata, Suwa (JP); Hideo Tanaya, Suwa (JP)

(73) Assignee: Seiko Epson Corporation (JP)

( * ) Notice: Subject to any disclaimer, the term of this patent is extended or adjusted under 35 U.S.C. 154(b) by 0 days.

(21) Appl. No.: 10/035,094

(22) Filed: Dec. 21, 2001

(65) Prior Publication Data

US 2002/0089386 A1 Jul. 11, 2002

(30) Foreign Application Priority Data

Dec. 25, 2000 (JP) .......................... 2000-392934

(51) Int. Cl.[7] ............................. H03B 5/32; H01L 41/04
(52) U.S. Cl. ........................................ 331/158; 310/370

(58) Field of Search .................... 331/108 D, 116 R, 331/116 FE, 158, 175; 310/318, 340, 345, 348, 367, 370

(56) References Cited

U.S. PATENT DOCUMENTS

| 3,697,766 A | * | 10/1972 | Ganter et al. ................ 310/348 |
| 4,384,232 A | * | 5/1983 | Debely ......................... 310/370 |
| 5,719,460 A | * | 2/1998 | Watarai et al. ............ 310/316.01 |

FOREIGN PATENT DOCUMENTS

| JP | 56-65517 | 6/1981 |
| JP | 61-111010 | 5/1986 |

* cited by examiner

Primary Examiner—David C. Mis
(74) Attorney, Agent, or Firm—Harness, Dickey & Pierce, P.L.C.

(57) ABSTRACT

A vibrating piece comprises a base and vibrating arms formed protruding from the base, wherein a groove is formed on at least one of the front side and rear side of the vibrating arms, and wherein notches are formed in the base.

20 Claims, 19 Drawing Sheets

[FIG. 5]
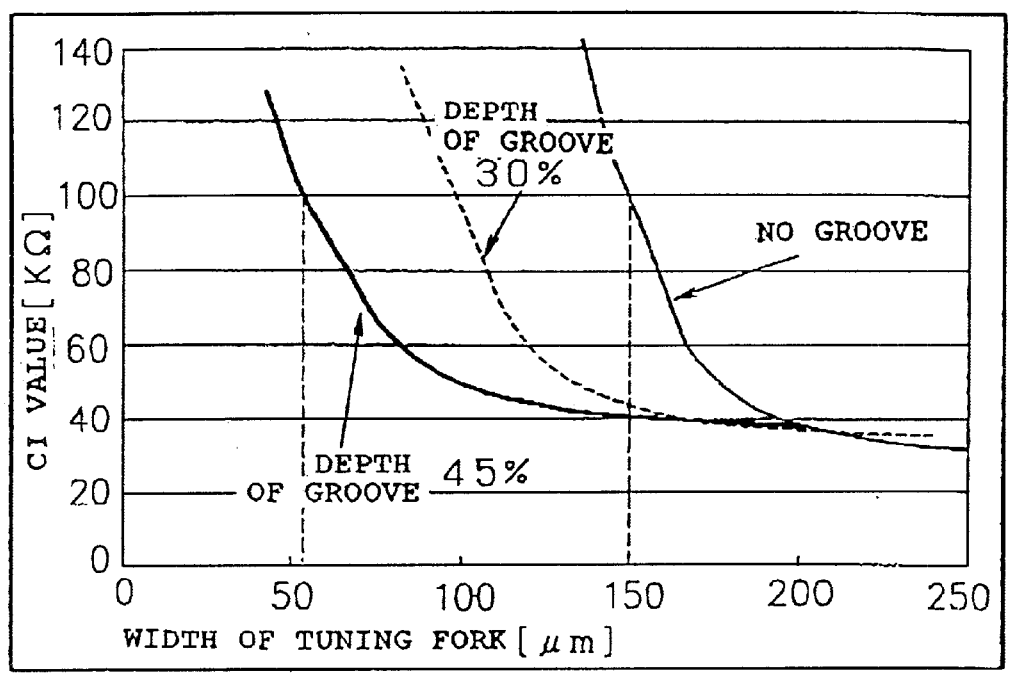

[FIG. 6]
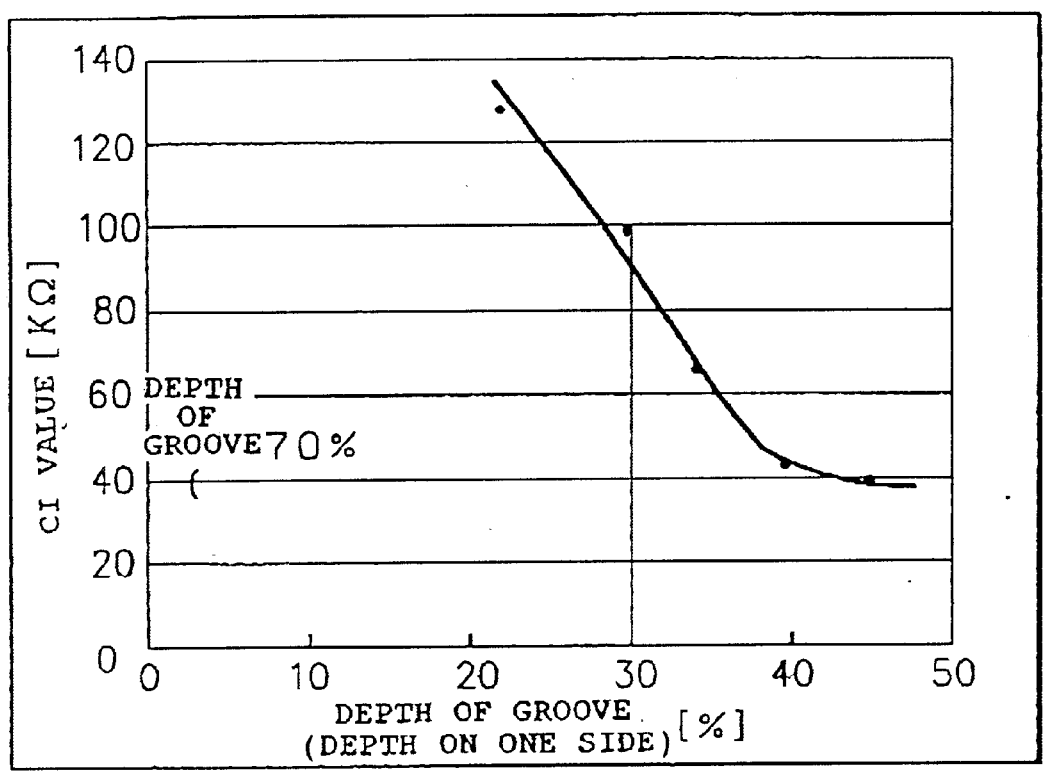

[FIG. 7]
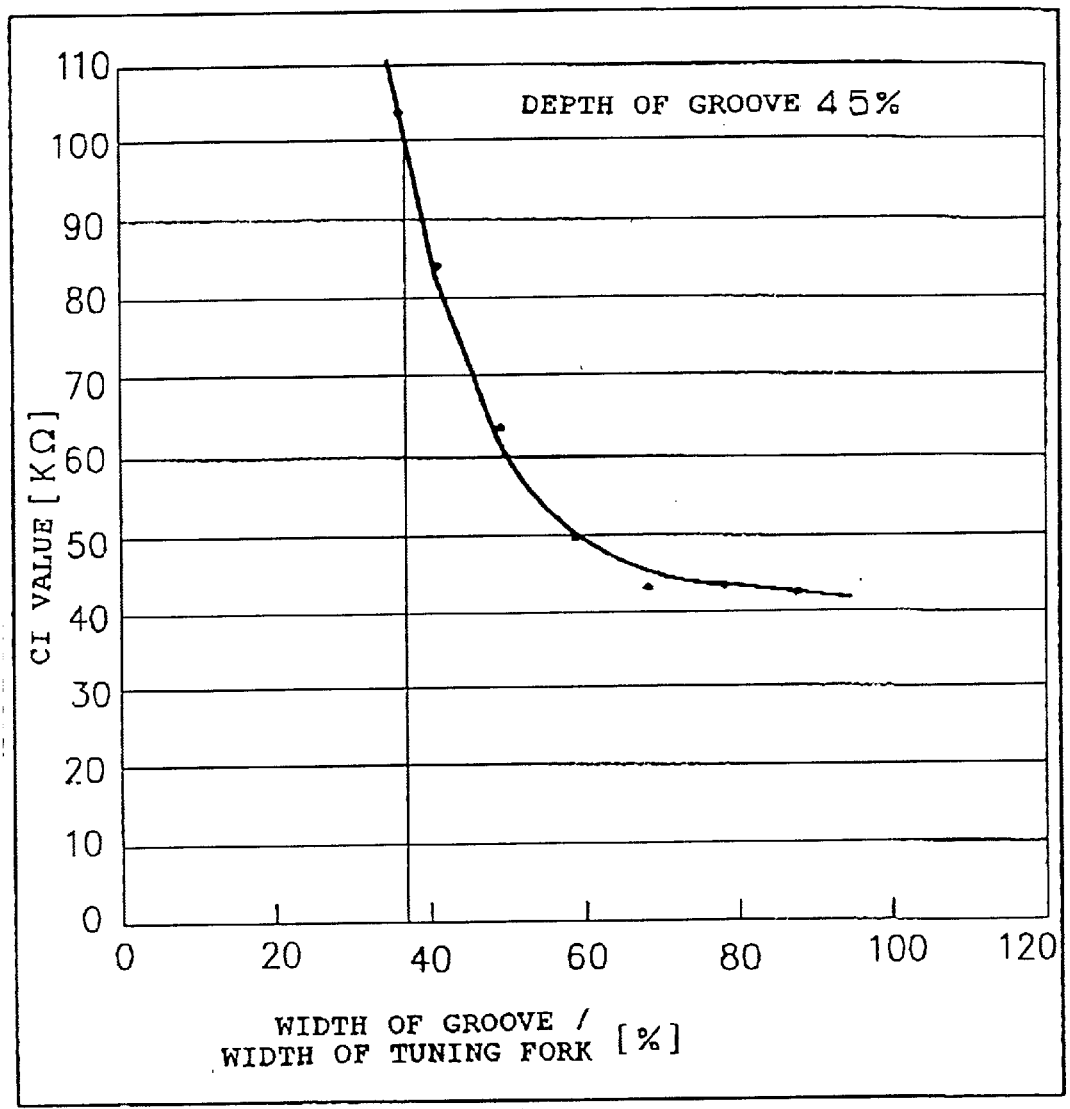

(FIG. 8)
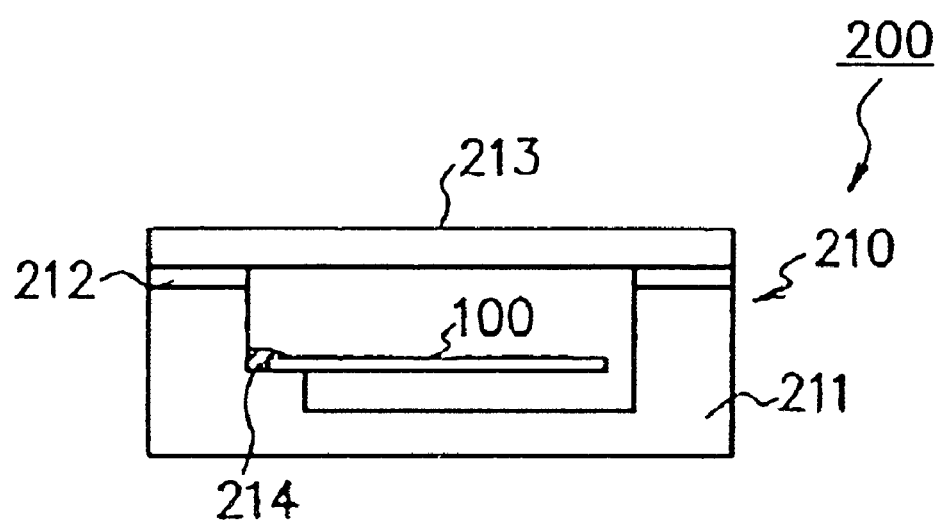

[FIG. 9]
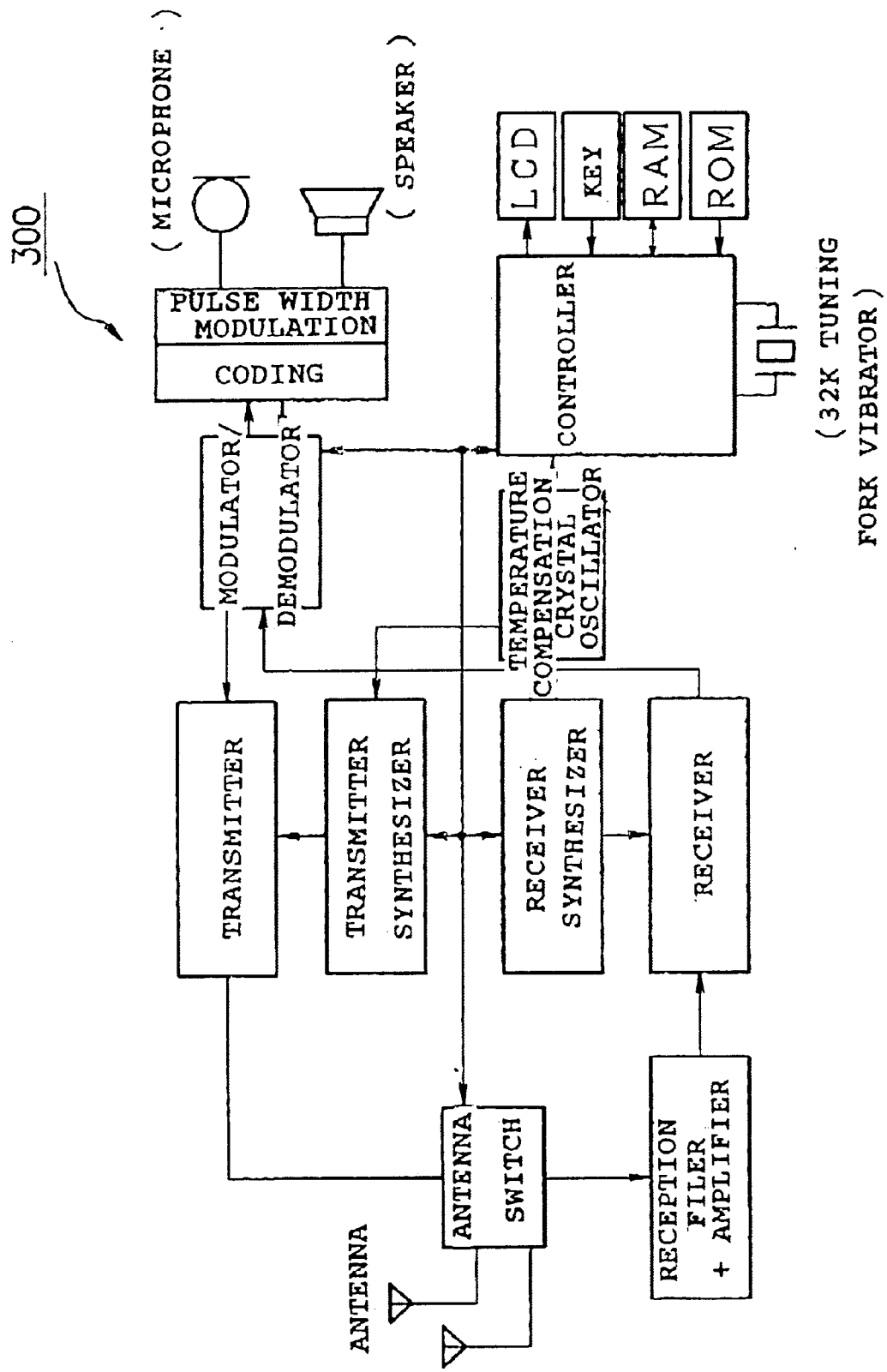

[FIG. 10]
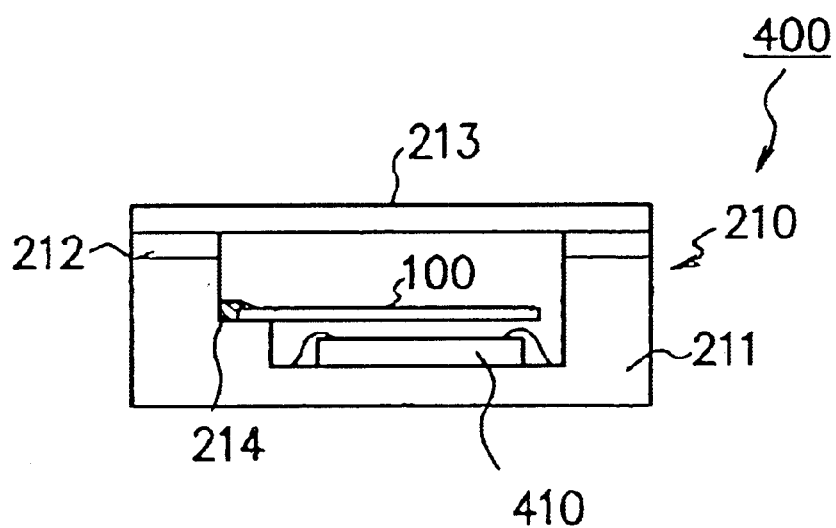

[FIG. 11]
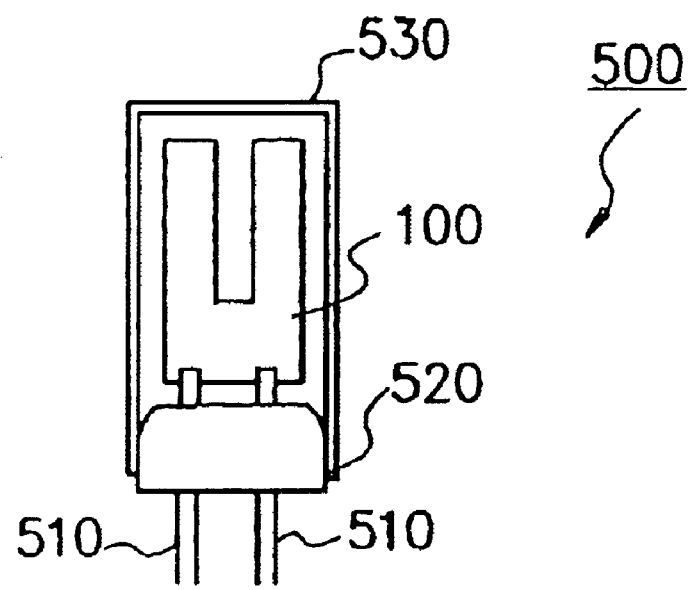

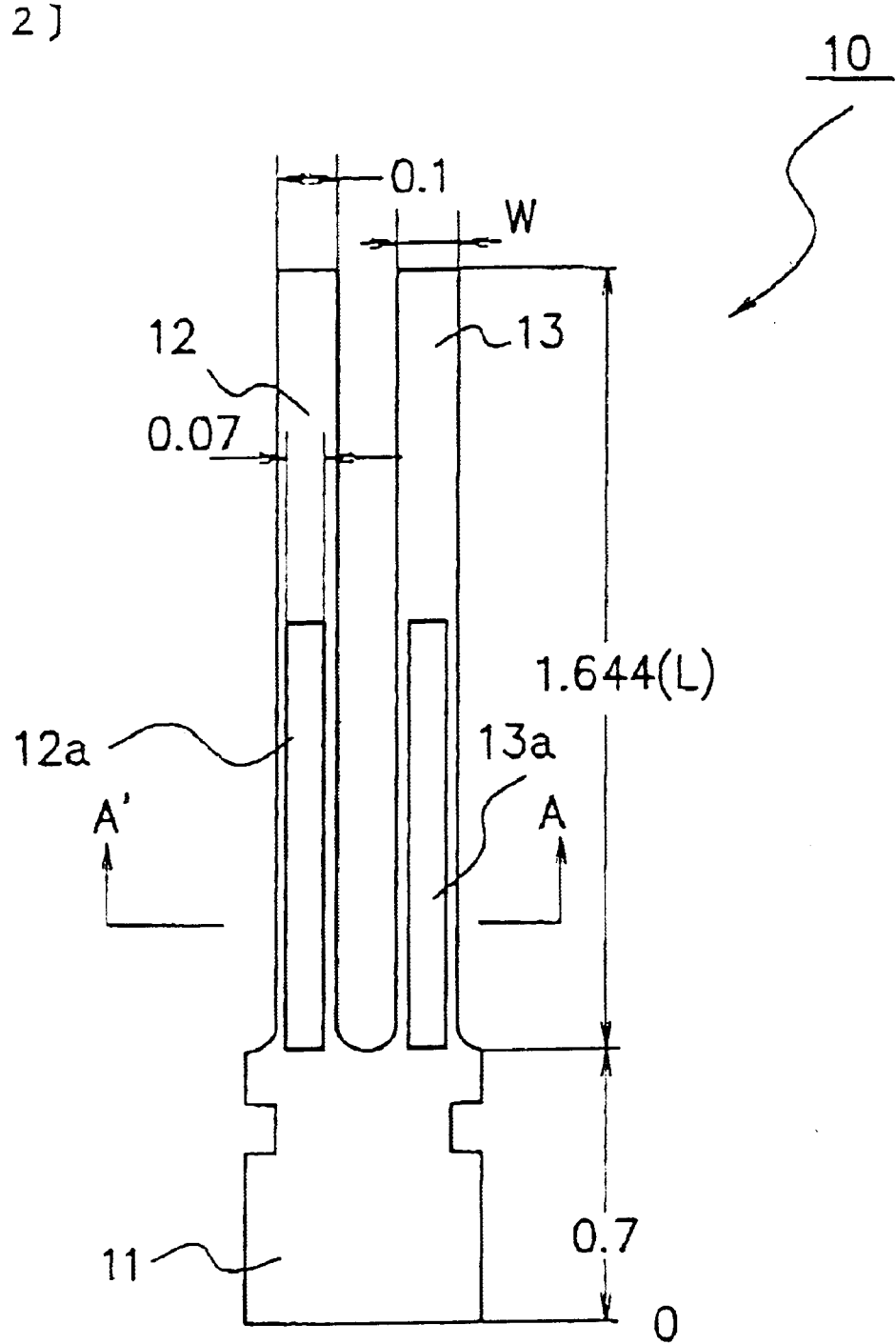

[FIG. 13]
(a)
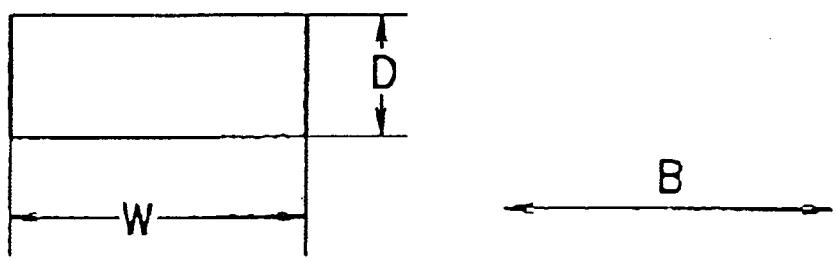
(b)
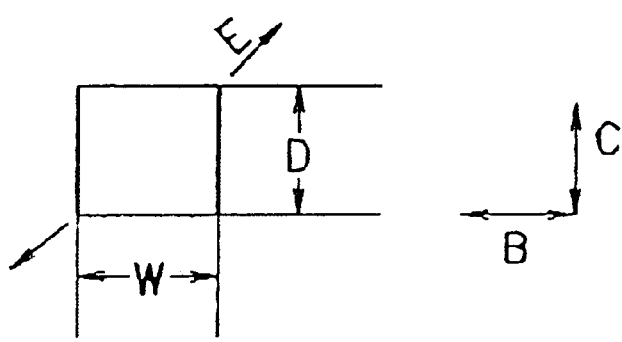

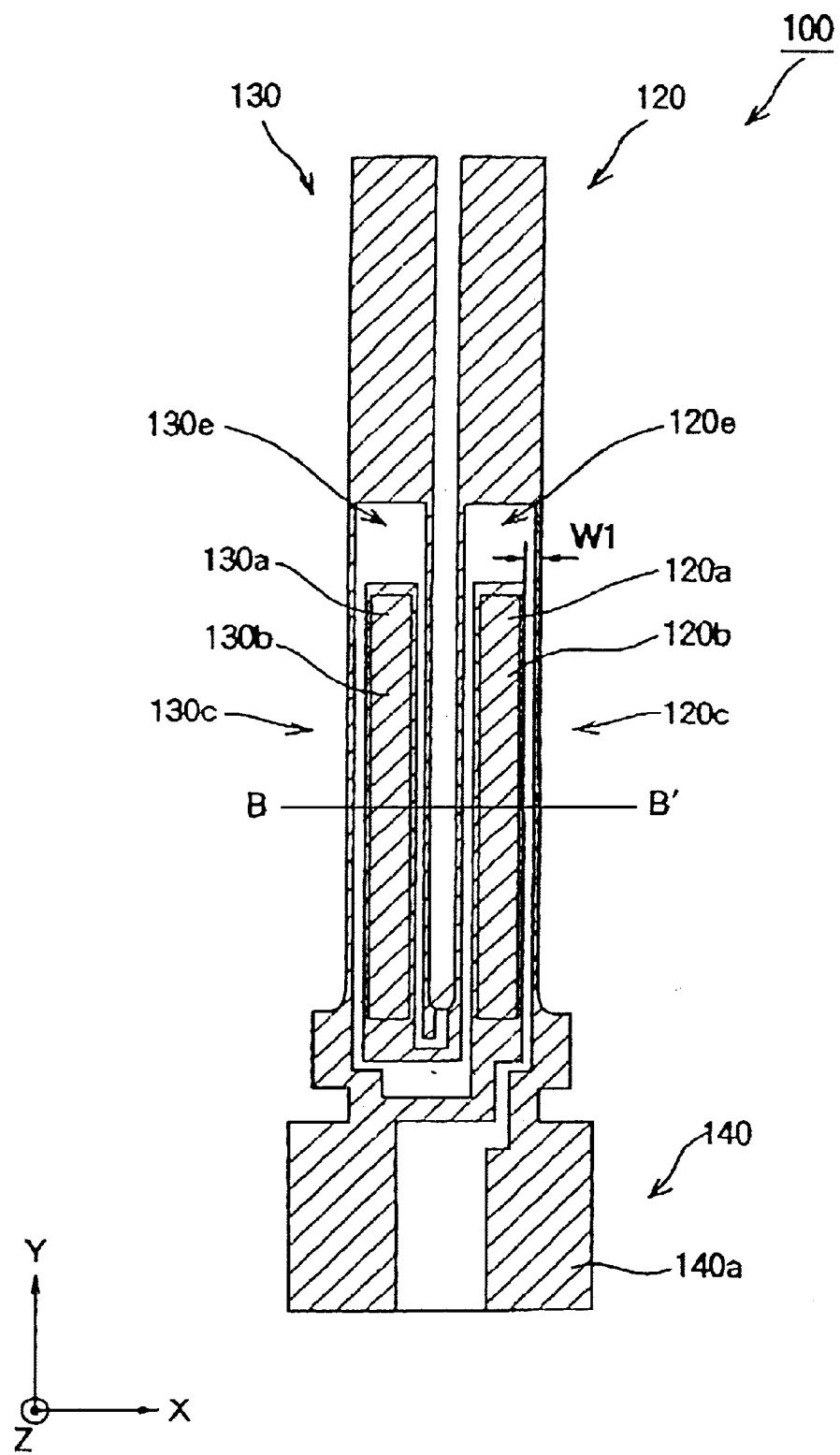
[FIG. 14]

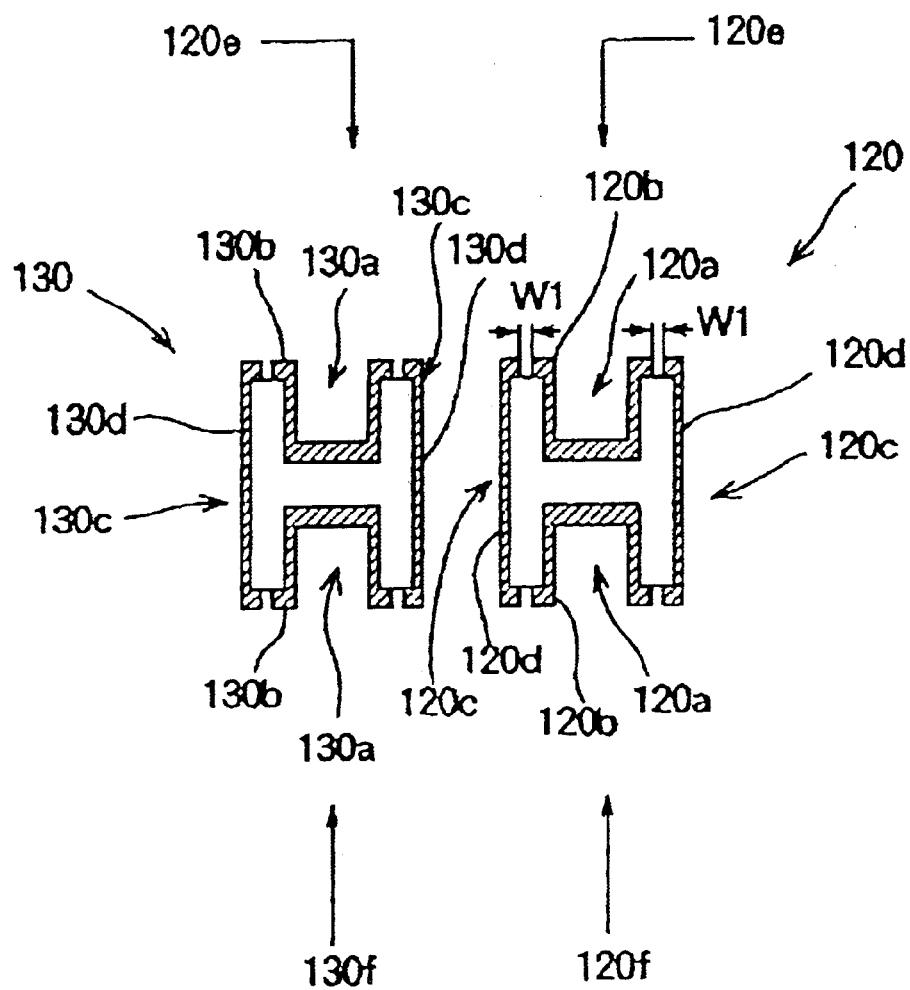
[FIG. 15]

[FIG. 16]
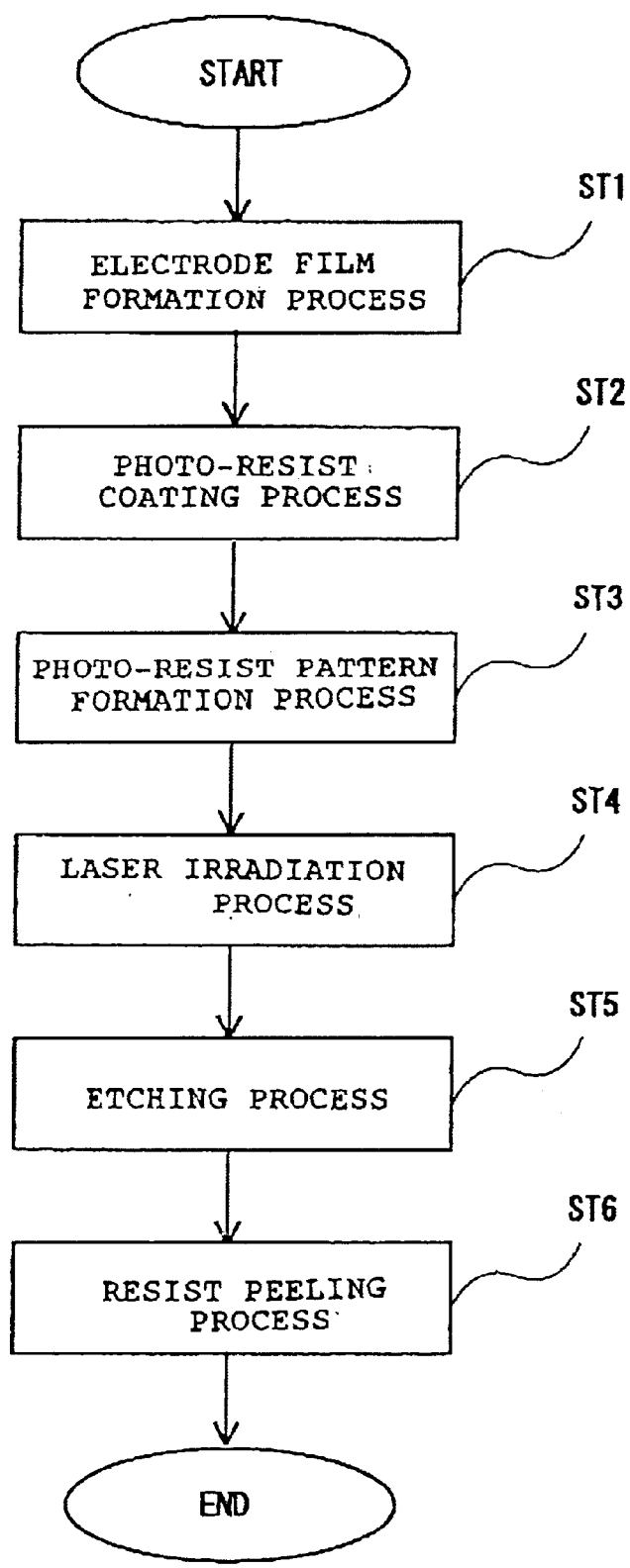

[FIG. 17]
(a)
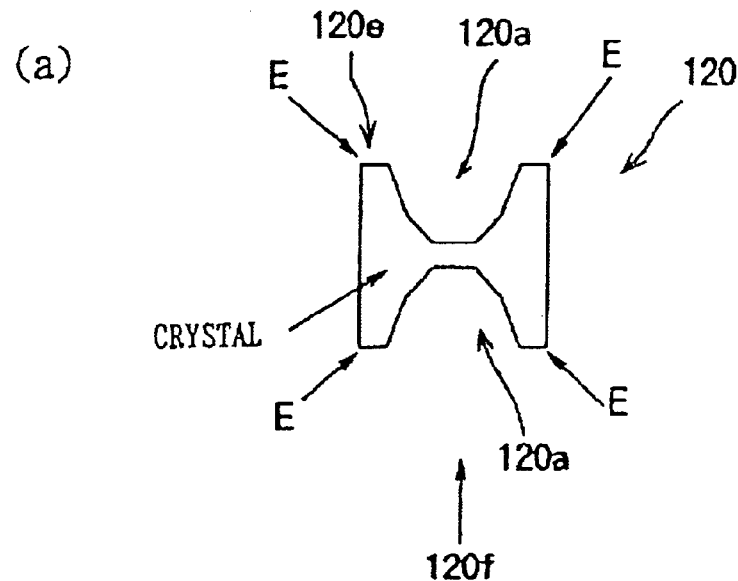
(b)
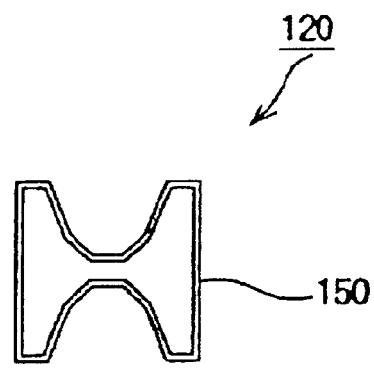
(c)
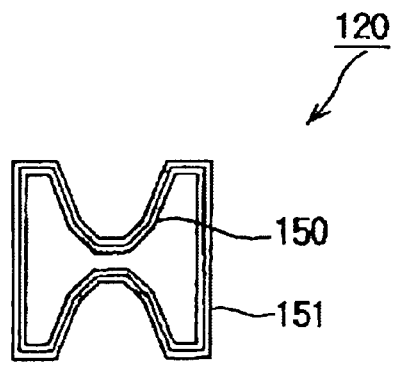

[FIG. 18]
(a)
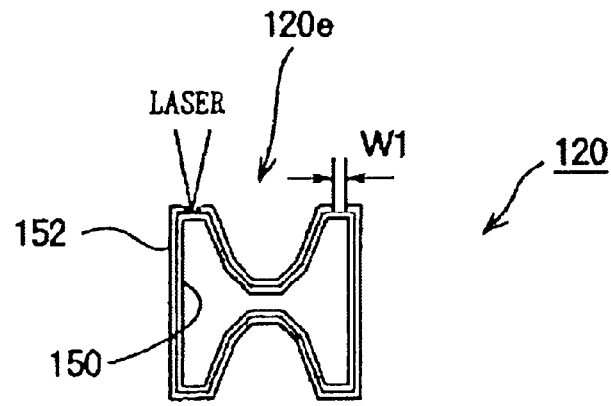
(b)
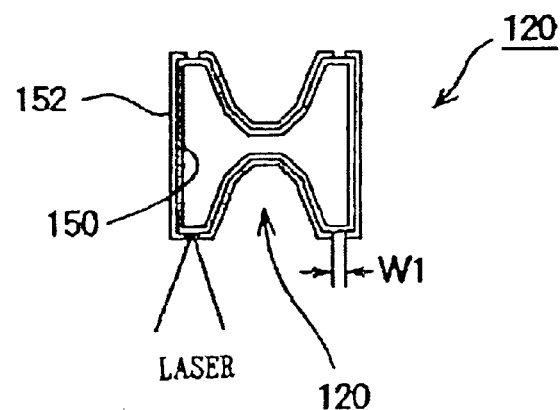
(c)
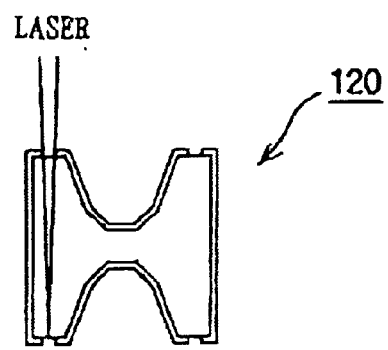

[FIG. 19]
(a)
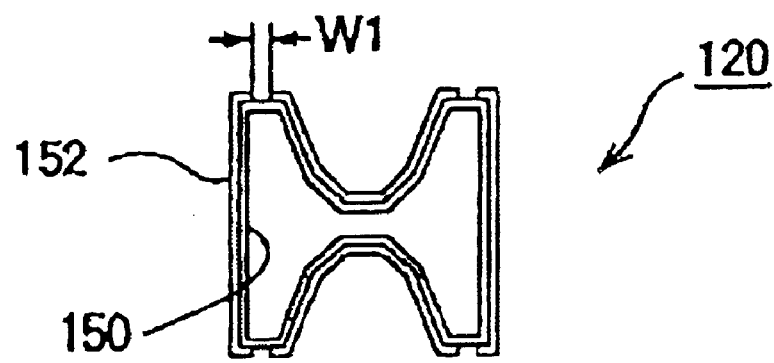
(b)
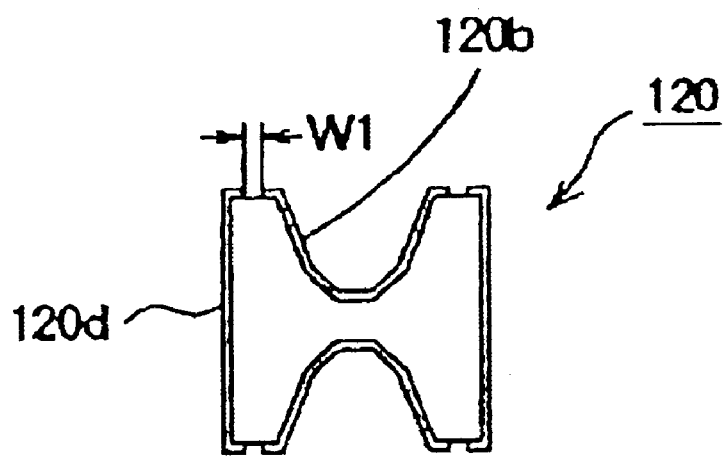

VIBRATING PIECE, VIBRATOR, OSCILLATOR, AND ELECTRONIC EQUIPMENT

FIELD OF THE INVENTION

The present invention relates to a vibrating piece formed of crystal or the like, a vibrator having the vibrating piece, and an oscillator or electronic equipment having the vibrator.

DESCRIPTION OF THE RELATED ART

Generally, tuning-fork type crystal vibrating pieces which are vibrating pieces have a base and two arms formed in a manner protruding from the base, with grooves formed on the front of each of the two arms. The grooves are formed in the same way on the back of the arms as well. Accordingly, the arms have a generally H-shaped cross-sectional form.

Such generally H-shaped tuning-fork type crystal vibrating pieces have properties wherein vibration loss at the arms is low even when the size of the vibrating piece is miniaturized, and the CI value (crystal impedance or equivalent series resistance) can also be suppressed to a low level.

Accordingly, generally H-shaped tuning-fork type crystal vibrating pieces are applied to, for example, vibrators wherein precise performance is required even when miniaturized.

As for the size of a generally H-shaped tuning-fork type crystal vibrating piece, the length of the arms is 1.644 mm, the width is 0.1 mm, and grooves of 0.07 mm in width are formed on the arms. Further, the length of the base in the lengthwise direction is 0.7 mm.

Even with such extremely small tuning-fork type crystal vibrating pieces, further miniaturization is required to handle the demand for miniaturization of recent devices such as electric equipment or the like.

In order to handle the demand for such miniaturization, forming the lengthwise direction at the base so as to be shorter than 0.7 mm causes the overall length of the vibrating piece to be shorter, so the vibrating piece is miniaturized, which is best, but this has caused the following problems.

That is, generally, in the event that the length of the base is not made to be 40% or more of the length of the arms, there is the problem that effects due to fixing irregularities of the vibrating piece are readily manifested, and irregularities in CI values between vibrating piece devices readily occurs.

Specifically, in the event that the thickness of the arms is D, the width of the arms is W, and the length of the arms is L, the frequency f of the tuning-fork type crystal vibrating piece must satisfy the relational expression of $$f W/L^2$$

That is, the relation is such that the short that the length L of the arms of the vibrating piece is, the narrower the width W of the arms is.

However, making the width W shorter as described above causes the vertical component of the vibration of the arms to increase, and in the event that the arms move the vibrations thereof are transmitted to the base of the vibrating piece, and energy escapes from the adhesive agent or the like at the fixing area of the base for fixing the vibrating piece to the package or the like.

Accordingly, in the event that vibrations leak to the base and energy escapes from the fixing area of the base, the vibrations of the arms in some vibrating pieces become unstable due to the effects of fixing irregularities in the vibrating pieces, increasing irregularities in CI values between devices.

In order to prevent such leaking of vibrations of the arms and escaping of energy from the fixing area of the base, length of 40% or more of the length L of the arms had to be secured at the base, as described above. Accordingly, this has been a hindrance in miniaturizing vibrating pieces themselves.

SUMMARY OF THE INVENTION

It is an object of the present invention to provide a vibrating piece wherein irregularities in IC value between vibrating pieces can be stabilized even in the event that the base is made shorter, while the overall vibrating piece can be miniaturized as well.

According to the present invention, the following vibration pieces (1) through (6) are preferably provided.

(1) A vibrating piece comprising: a base; and vibrating arms formed protruding from the base; wherein a groove is formed on at least one of the front side and rear side of the vibrating arms, and wherein notches are formed in the base.

(2) A vibrating piece comprising: a base; and vibrating arms formed protruding from the base; wherein a groove is formed on at least one of the front side and rear side of the vibrating arms and notches are formed in the base, and wherein the vibrating arms are generally parallelepiped, the width of the arm portion which is the short side of the front side thereof being 50 μm or longer but 150 μm or shorter.

(3) A vibrating piece comprising: a base; and vibrating arms formed protruding from the base; wherein a groove is formed on both of the front side and rear side of the vibrating arms, and wherein the depth of a groove formed on either the front side or rear side is 30% or more of the thickness of the vibrating arm which is the full length thereof in the depth direction but less than 50% thereof.

(4) A vibrating piece comprising: a base; and vibrating arms formed protruding from the base; wherein a groove is formed on both of the front side and rear side of the vibrating arms, and wherein the depth of a groove formed on either the front side or rear side is 40% or more of the thickness of the vibrating arm which is the full length thereof in the depth direction but less than 50% thereof.

(5) A vibrating piece comprising: a base; and vibrating arms formed protruding from the base; wherein a groove is formed on both of the front side and rear side of the vibrating arms, and wherein the depth of a groove formed on either the front side or rear side is 30% or more of the thickness of the vibrating arm which is the full length thereof in the depth direction but less than 50% thereof, and wherein the groove width which is the short side of the opening of the groove is 40% or more of the width of arm of the vibrating arm.

(6) A vibrating piece comprising: a base; and vibrating arms formed protruding from the base; wherein a groove is formed on both of the front side and rear side of the vibrating arms, and wherein the depth of a groove formed on either the front side or rear side is 30% or more of the thickness of the vibrating arm which is the full length thereof in the depth direction but less than 50% thereof, and wherein the groove width which is the short side of the opening of the groove is 70% or more of the width of arm of the vibrating arm but less than 100% thereof.

BRIEF DESCRIPTION OF THE DRAWING

FIG. 5 is a diagram illustrating the relation between the tuning-fork arm width and CI value.

FIG. 6 is a diagram illustrating the relation between the depth of the groove and CI value.

FIG. 7 is a diagram illustrating the relation between the percentage of the groove depth as to the tuning-fork arm width and CI value.

FIG. 8 is a schematic cross-sectional view illustrating the configuration of a ceramic package tuning-fork type vibrator according to a second embodiment.

FIG. 9 is a schematic diagram illustrating a circuit block for a digital cellular telephone according to a third embodiment.

FIG. 10 is a schematic cross-sectional diagram illustrating the configuration of a tuning-fork crystal oscillator according to a fourth embodiment of the present invention.

FIG. 11 is a schematic cross-sectional diagram illustrating the configuration of a cylinder type tuning-fork vibrator according to a fifth embodiment of the present invention.

FIG. 12 is an ordinary tuning-fork type crystal vibrating piece.

FIG. 13 is (a) an explanatory diagram of vibration of the arms. (b) another explanatory diagram of vibration of the arms.

FIG. 14 is a schematic diagram illustrating a tuning-fork type crystal vibrating piece 100 manufactured with the method for manufacturing a vibrating piece according to a first embodiment of the present invention.

FIG. 15 is a schematic cross-sectional diagram along line B-B' in FIG. 14

FIG. 16 is a schematic flowchart illustrating the electrode forming process.

FIG. 17 is a schematic diagram illustrating the process of forming electrodes on the tuning-fork arms.

FIG. 18 is a schematic diagram illustrating another process of forming electrodes on the tuning-fork arms.

FIG. 19 is a schematic diagram illustrating another process of forming electrodes on the tuning-fork arms.

DESCRIPTION OF THE PREFERRED EMBODIMENTS

Figure 1:
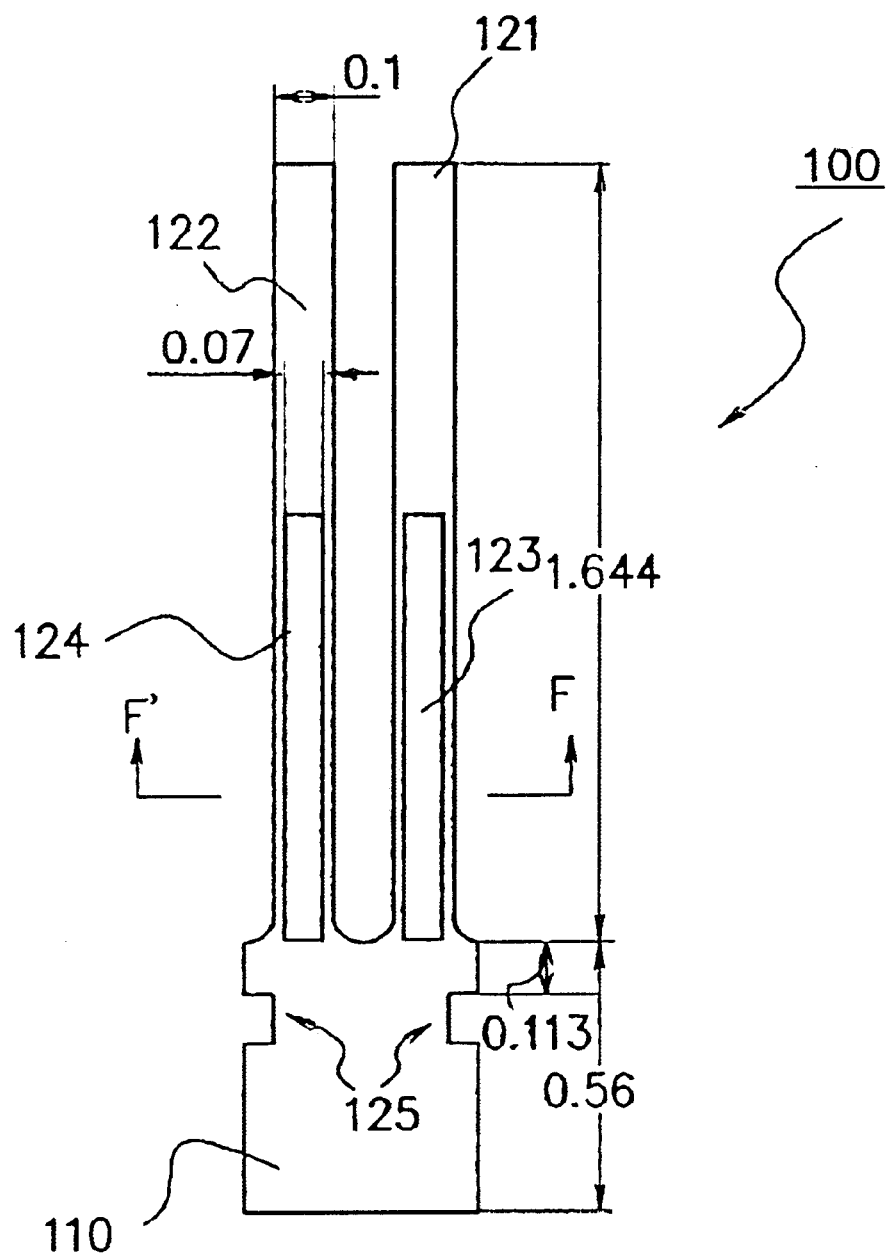
FIG. 1 is a schematic diagram of a tuning-fork type crystal vibrating piece according to a first embodiment.

The following embodiments are preferably provided regarding each of the inventions of the above-described (1) through (6). Note however, that the present invention is not restricted to these embodiments.

(7) A vibrating piece according to any of (1) through (6), wherein the base comprises a fixing area for fixing the vibrating piece, and wherein the notches are provided between the fixing area of the base and the vibrating arms.

(8) A vibrating piece according to any of (1) through (6), wherein the vibrating piece is a tuning-fork type oscillating piece formed of a crystal which oscillates at around 30 KHz to 40 KHz.

(9) A vibrator comprising a vibrating piece having a base and vibrating arms formed protruding from the base, the vibrator stored in a package;
wherein a groove is formed on at least one of the front side and rear side of the vibrating arms of the vibrating piece, and wherein notches are formed in the base.

(10) A vibrator comprising a vibrating piece having a base and vibrating arms formed protruding from the base, the vibrator stored in a package; wherein a groove is formed on at least one of the front side and rear side of the vibrating arms and notches are formed in the base, and wherein the vibrating arms are generally parallelepiped, the width of the arm portion which is the short side of the front side thereof being 50 $\mu$m or longer but 150 $\mu$m or shorter.

(11) A vibrator comprising a vibrating piece having a base and vibrating arms formed protruding from the base, the vibrator stored in a package; wherein a groove is formed on both of the front side and rear side of the vibrating arms, and wherein the depth of a groove formed on either the front side or rear side is 30% or more of the thickness of the vibrating arm which is the full length thereof in the depth direction but less than 50% thereof.

(12) A vibrator comprising a vibrating piece having a base and vibrating arms formed protruding from the base, the vibrator stored in a package; wherein a groove is formed on both of the front side and rear side of the vibrating arms, and wherein the depth of a groove formed on either the front side or rear side is 40% or more of the thickness of the vibrating arm which is the full length thereof in the depth direction but less than 50% thereof.

(13) A vibrator comprising a vibrating piece having a base and vibrating arms formed protruding from the base, the vibrator stored in a package; wherein a groove is formed on both of the front side and rear side of the vibrating arms, and wherein the depth of a groove formed on either the front side or rear side is 30% or more of the thickness of the vibrating arm which is the full length thereof in the depth direction but less than 50% thereof, and wherein the groove width which is the short side of the opening of the groove is 40% or more of the width of arm of the vibrating arm.

(14) A vibrator comprising a vibrating piece having a base and vibrating arms formed protruding from the base, the vibrator stored in a package; wherein a groove is formed on both of the front side and rear side of the vibrating arms, and wherein the depth of a groove formed on either the front side or rear side is 30% or more of the thickness of the vibrating arm which is the full length thereof in the depth direction but less than 50% of the depth thereof, and wherein the groove width which is the short side of the opening of the groove is 70% or more of the width of arm of the vibrating arm but less than 100% thereof.

(15) A vibrator according to any of (9) through (14), wherein the base of the vibrating piece comprises a fixing area for fixing the vibrating piece, and wherein the notches are provided between the fixing area of the base and the vibrating arms.

(16) A vibrator according to any of (9) through (14), wherein the vibrating piece is a tuning-fork oscillating piece formed of a crystal which oscillates at around 30 KHz to 40 KHz.

(17) A vibrator according to any of (9) through (14), wherein the package is in a box form.

(18) A vibrator according to any of (9) through (14), wherein the package is formed as a so-called cylinder type.

(19) An oscillator comprising: a vibrating piece having a base and vibrating arms formed protruding from the base; and an integrated circuit; the vibrating piece and integrated circuit stored in a package; wherein a groove is formed on at least one of the front side and rear side of the vibrating arms of the vibrating piece, and wherein notches are formed in the base.

(20) Electronic equipment wherein a vibrator is connected to a control unit so as to use the vibrator; the vibrator comprising a vibrating piece having a base and vibrating arms formed protruding from the base, the vibrating piece stored in a package; wherein a groove is formed on at least one of the front side and rear side of the vibrating arms of the vibrating piece, and wherein notches are formed in the base.

The following is a more specific description of the embodiments of the vibrating piece according to the present invention, with reference to the drawings.

FIG. 1 is a diagram illustrating a tuning-fork type crystal vibrating piece 100 which is a vibrating piece according to a first embodiment of the present invention.

The tuning-fork type crystal vibrating piece 100 is formed by cutting out a single crystal of crystal to form a so-called crystal Z-plate, for example. Also, the tuning-fork type crystal vibrating piece 100 shown in FIG. 1 is a vibrating piece which emits signals at 32.768 KHz for example, and accordingly is an extremely small type vibrating piece.

As shown in FIG. 1, such a tuning-fork type crystal vibrating piece 100 has a base 110. Then, two tuning-fork arms 121 and 122 which are vibrating arms are disposed so as to protrude upwards in the figure from this base 110.

Figure 2:
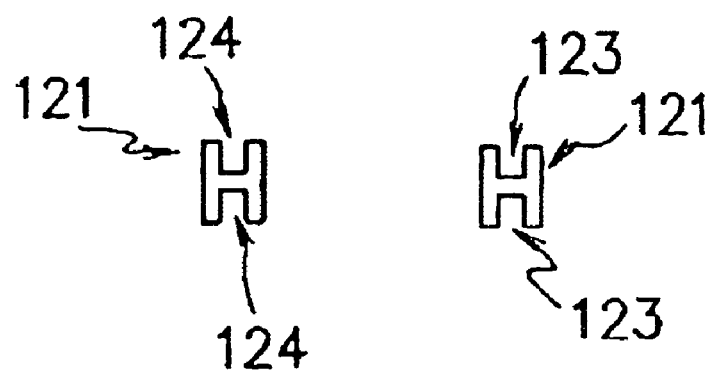
FIG. 2 is a schmetic cross-sectional view along line F-F' in FIG. 1.

Also, grooves 123 and 124 are formed on the front and rear of the tuning-fork arms 121 and 122 as shown in FIG. 1. These grooves 123 and 124 are formed on the rear sides of the tuning-fork arms 121 and 122 not shown in FIG. 1, in the same manner, and accordingly the cross-sectional view along F-F' in FIG. 1 has a generally H-shaped form, as shown in FIG. 2.

Now, with the base 110 of the tuning-fork type crystal vibrating piece 100, the entirety thereof is formed in a generally plate-shaped form. The length in the longitudinal direction in the figure is formed to 0.56 mm, for example.

On the other hand, the length in the longitudinal direction in the drawing of the tuning-fork arms 121 and 122 disposed protruding from the base 110 is formed to 1.644 mm, for example. Accordingly, the length of the base 110 as to the tuning-fork arms 121 and 122 is approximately 34%. Comparatively, with an ordinary tuning-fork type crystal vibrating piece 10, as shown in FIG. 12, the length of the base 11 is 0.7 mm and the length of the arms 12 and 13 is formed to 1.644 mm, so the length of the base 11 as to the arms 12 and 13 is approximately 42.6%, thus exceeding 40%.

Making the length of the base 11 to be a length of 40% or more as to the length of the arms 12 and 13 in this manner prevents increase in irregularities in CI values between vibrating piece devices due to vibration leakage from vibrations of the arms 12 and 13 as described above.

Conversely, the length of the base 110 of the tuning-fork type crystal vibrating piece 100 according to the present embodiment is formed so as to be 34% of the length of the tuning-fork arms 121 and 122 as described above, so with the same configuration as the conventional tuning-fork type crystal vibrating piece 10, vibration leakage from vibrations of the tuning-fork arms 121 and 122 would occur, increasing irregularities in CI values between vibrating piece devices.

However, with the present embodiment, two notches 125 are provided on both sides of the base 110, as shown in FIG. 1.

Figure 3:
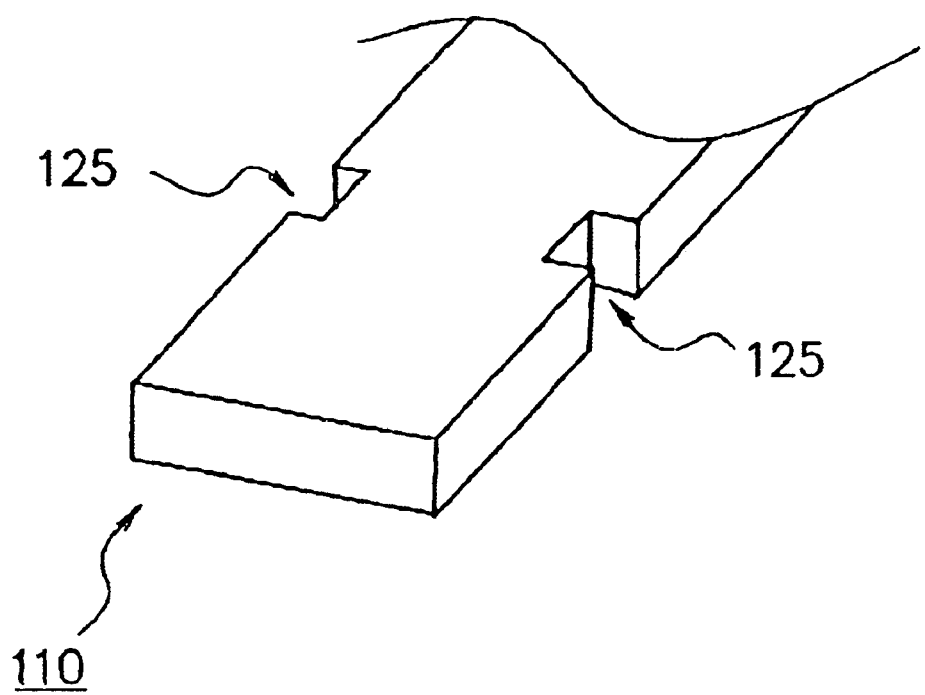
FIG. 3 is a schematic perspective view illustrating the configuration of notches on the base in FIG. 1.

FIG. 3 illustrates this state. FIG. 3 is a schematic perspective view illustrating the positioned state of the notches 125 on the base 110 shown in FIG. 1.

As shown in FIG. 3, the notches 125 are formed rectangular.

Such notches 125 are formed heading downwards from 0.113 mm below the upper end of the base 110, as shown in FIG. 1.

Figure 4:
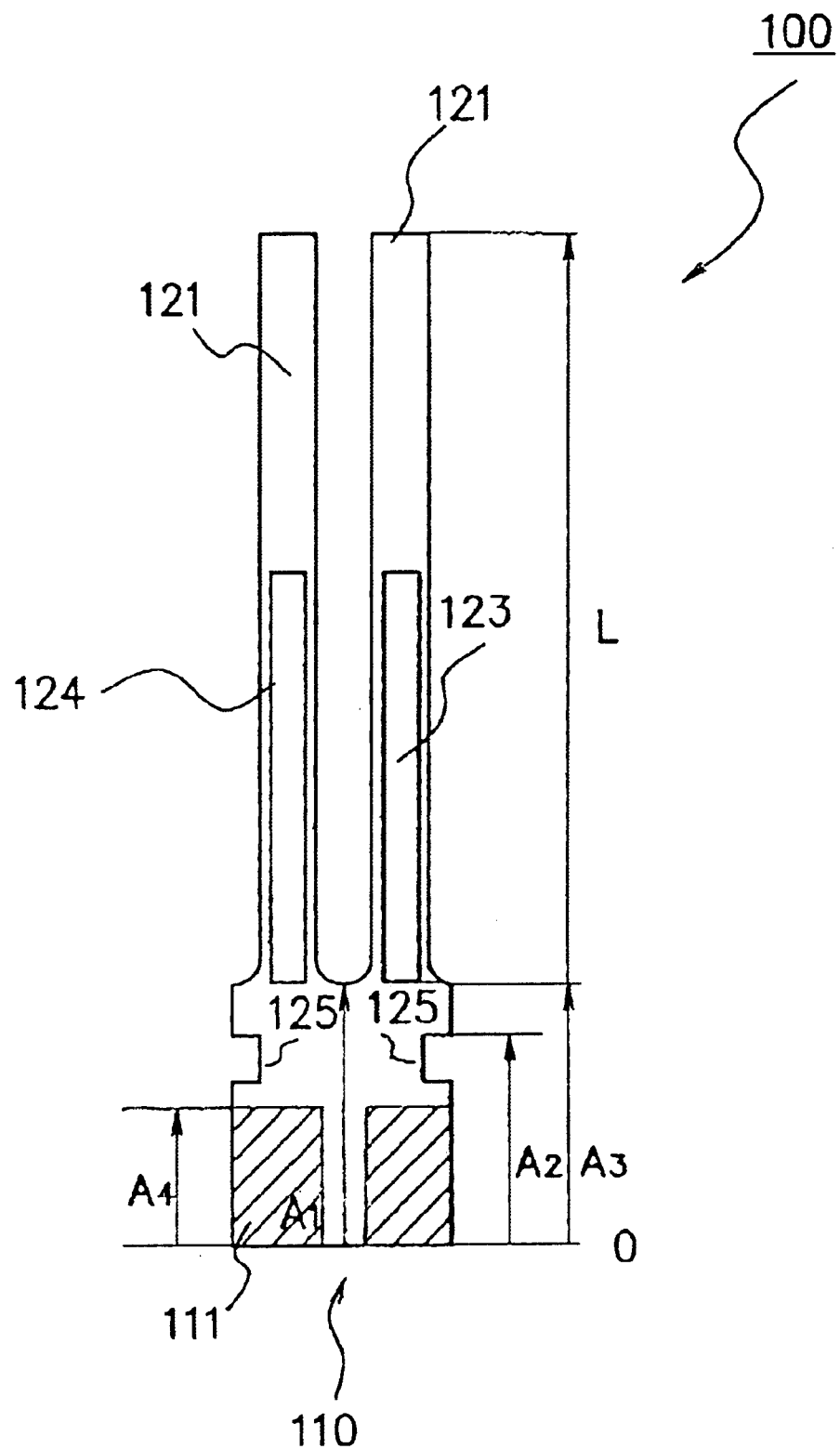
FIG. 4 is an explanatory diagram of the tuning-fork type crystal vibrator shown in FIG. 1.

FIG. 4 illustrates the positioning conditions of the notches 125 on the base 110. In FIG. 4, the length from the bottom face of the base 110 to the upper end of the base 110, specifically to the fork of the two tuning-fork arms 121, is A1.

Also, the length from the bottom face of the base 110 to the upper end of the notches 125 is A2.

Also, with the length from the bottom face of the base 110 to the lower end of the grooves 123 and 124 formed on the tuning-fork arms 121 and 122 as A3, the notches 125 are formed such that the length of A3 is longer than the length of A2.

Also, the length of A3 is formed so that the length of A3 is the same as the length of A1, or so that the length of A3 is longer than the length of A1. Accordingly, the grooves 123 and 124 are not formed closer to the bottom face of the base 110 than the bottom of the tuning-fork arms 121 and 122.

From the above-described relation, the position of the notches 125 formed on the base 110 is always positioned downwards from the lower end of the grooves 123 and 124 of the tuning-fork arms 121 and 122.

Accordingly, the existence of the notches 125 never interferes with the vibration of the tuning-fork arms 121 and 122.

Also, the hatched portion in FIG. 4 is a fixing area 111 where the tuning-fork type crystal vibrating piece 100 is actually fixed at the time of fixing to the package. A4 represents the length between the upper end of the fixing area 111 and the bottom face of the base 110.

Here, the positional relation between the fixing area 111 and the notches 125 is such that the length of A2 is always longer than the length of A4.

Accordingly, the upper end of the notches 125 are always positioned above the fixing area 111 in FIG. 4, so the notches 125 do not affect the fixing area 111, and there are no adverse effects on the fixing state with regard to the package of the tuning-fork type crystal vibrating piece 100.

The notches 125 which are provided to the base 110 in such a manner are provided at positions where there are no adverse effects thereof on the vibrating of the tuning-fork arms 121 and 122 of the tuning-fork type crystal vibrating piece 100. Further, the notches 125 are also provided at positions where there are no adverse effects thereof on the package of the tuning-fork type crystal vibrating piece 100.

The notches 125 which are provided at such a position are provided closer to the base 110 side below the position of the grooves 123 and 124 of the tuning-fork arms 121 and 122. Accordingly, leakage vibrations leaking from the grooves 123 and 124 due to vibrating of the tuning-fork arms 121 and 122 are not readily transmitted to the fixing area 111 of the base 110, due to the notches 125.

Accordingly, transmission of leakage vibrations to the fixing area 111 and energy escaping does not readily occur, and while irregularities in CI values between vibrating piece devices conventionally occurred at 10 KΩ or higher at standard deviation, but due to this, the standard deviation has been drastically reduced to 1 KΩ.

Thus, irregularities in CI values between vibrating piece devices can be stabilized, so there is no need to make the length of the base 11 to be 40% or more as to the length of the arms 12 and 13 as with the conventional tuning-fork type crystal vibrating piece 10.

With the present embodiment, as shown in FIG. 1, even though the length of the base 110 of the tuning-fork type crystal vibrating piece 100 is formed so as to be 34% of the length of the tuning-fork arms 121 and 122 as described above, vibration leakage due to vibrations of the tuning-fork arms 121 and 122 does not readily occur and irregularities in CI values between vibrating piece devices can be stabilized. Accordingly, the length of the base 110 can be shortened, and the size of the tuning-fork type crystal vibrating piece 100 can be miniaturized.

With the present embodiment, the length of the base 110 can be made to be 0.56 mm as shown in FIG. 1, and can be made to be markedly smaller than 0.7 mm which is the length of the 11 base of the conventional tuning-fork type crystal vibrating piece 10 shown in FIG. 12.

Formed on a protruding manner from the base 110 thus formed are the tuning-fork arms 121 and 122 shown in FIG. 1.

The width of each of the tuning-fork arms 121 and 122 is formed to 0.1 mm, as shown in FIG. 1. The reason that the arm width of the tuning-fork arms 121 and 122 is thus made to be markedly narrow is due to the fact that the length (L) of the tuning-fork arms 121 and 122 has been shortened, as described in detail with the explanation of "f W/L$^2$" which is the above-described Expression 1.

That is, from the above Expression 1, there is the need to form the arm width to 0.1 mm in order to shorten the length of the tuning-fork arms 121 and 122 to 1.644 mm as shown in FIG. 1, and this is why the arm width is 0.1 mm.

However, in the event that the arm width of the tuning-fork arms 121 and 122 is thus made to be 0.1 mm, there is the concern that the CI value may increase.

Accordingly, with the present embodiment, grooves 123 and 124 are provided on the front and rear of the tuning-fork arms 121 and 122 as shown in FIG. 1, to suppress increase in the CI value.

FIG. 5 is a diagram illustrating the relation between the width of the tuning-fork arms 121 and 122 and the CI value in the event that the groove width is 70% of the arm width. As shown in FIG. 5, with tuning-fork arms wherein grooves are not provided, as indicated by the two-dot broken line, in the event that the arm width is narrower than 0.15 mm, this exceeds 100 KΩ which is the practical CI value, making for a tuning-fork type crystal vibrator which is practically unusable.

However, with the tuning-fork type crystal vibrating piece 100 according to the present embodiment, grooves 123 and 124 are provided on the front and rear of the tuning-fork arms 121 and 122 as shown in FIG. 1, so even in the event that the arm width of the tuning-fork arms 121 and 122 is 0.1 mm as shown in FIG. 5, this is contained within 100 KΩ which is the practical CI value, making for a practical vibrating piece.

Also, with FIG. 5, keeping the depth of the grooves to within 45% of the thickness direction of the tuning-fork arms 121 and 122 allows the CI value of the vibrating piece to be contained within 100 KΩ which is the practical CI value even in the event that the arm width is 0.05 mm.

Thus, rise in the CI value can be suppressed by providing grooves 123 and 124 on the front and rear of the tuning-fork arms 121 and 122, but there is the need for the depth of the grooves 123 and 124 to be 30% or more but less than 50% of the thickness of the tuning-fork arms 121 and 122.

FIG. 6 is a diagram illustrating the relation between the groove depth (on one side) and the CI value in the event that the groove width is 70% of the arm width. As shown in FIG. 6, in the event that the depth of the grooves 123 and 124 is 30% or more but less than 50% of the thickness of the tuning-fork arms 121 and 122, the CI value is contained within 100 KΩ which is practical.

On the other hand, in the event that the depth of the grooves 123 and 124 is 50% or more, these become through holes since the grooves 123 and 124 are provided on the front and rear of the tuning-fork arms 121 and 122, meaning that frequencies are emitted at places other than the desired frequencies.

Now, as shown in FIG. 6, in the event that the depth of the grooves 123 and 124 is 40% or more but less than 50%, not only is the CI value contained within 100 KΩ which is practical, but the CI value is stabilized.

The grooves 123 and 124 according to the present embodiment are 0.045 mm which is 45% in the thickness direction of the tuning-fork arms 121 and 122.

Further, with the present embodiment, the groove width of the grooves 123 and 124 provided on the front and rear of the tuning-fork arms 121 and 122 is made to be 0.07 mm. This groove width 0.07 mm is 70% of the arm width 0.1 mm of the tuning-fork arms 121 and 122.

FIG. 7 illustrates the relation between the percentage of groove width as to the arm width and the CI value. As shown in FIG. 7, in the event that the groove width is 40% or more of the arm width, the CI value is contained within 100 KΩ which is practical.

In the event that the groove width is formed at 70% or more of the arm width, irregularities in CI values between vibrating piece devices are stabilized, as shown in FIG. 7.

Electrodes or the like not shown in the drawings are positioned at predetermined positions on the tuning-fork type crystal vibrating piece 100 according to the present embodiment configured as described above, disposed within a package or the like, and upon voltage being applied, the tuning-fork arms 121 and 122 vibrate, with the arm width and thickness of the tuning-fork arms 121 and 122 being both formed at 0.1 mm as described above.

Accordingly, vertical component vibrations are applied as shown in FIG. 13(*b*), and the tuning-fork arms 121 and 122 vibrate, but the vibrations are dampened at the notches 125 of the base 110, thereby preventing beforehand energy from escaping from the fixing area 111 of the base 110 and vibrations leaking, increasing irregularities in CI values between vibrating piece devices.

Also, the notches 125 do not interfere with the vibrations of the tuning-fork arms 121 and 122, and are always positioned on a position on the base 110 which does not affect the fixing of the fixing area 111 of the base 110, so there are no adverse effects on vibrations of the tuning-fork arms 121 and 122 or the fixing state with regard to the package of the tuning-fork type crystal vibrating piece 100.

Further, the length of the base 110 can be shortened more than conventional vibrating pieces, so the tuning-fork type crystal vibrating piece 100 can be miniaturized, thereby enabling miniaturization of vibrators and the like carrying such vibrating pieces.

Also, not only is the miniaturized tuning-fork type crystal vibrating piece 100 contained within 100 KΩ which is the practical IC value, but the depth and groove width of the grooves 123 and 124 are adjusted such that the irregularities in CI values between vibrating piece devices are stabilized, thereby yielding a super-small vibrating piece with even higher precision.

FIG. 8 is a diagram illustrating a ceramic package tuning-fork type vibrator 200 which is a vibrator according to a second embodiment of the present invention.

The tuning-fork type vibrator 200 uses the tuning-fork type crystal vibrating piece 100 according to the first embodiment described above. Accordingly, with regard to the configuration, operations, etc. of the tuning-fork type crystal vibrating piece 100, the same reference numerals will be used, and the description thereof will be omitted.

FIG. 8 is a schematic cross-sectional view illustrating the configuration of a ceramic package tuning-fork type vibrator 200. The ceramic package tuning-fork type vibrator 200 shown in FIG. 8 has a box-shaped package 210 with a space therein.

The package 210 comprises a base portion 211 at the bottom thereof. This base portion 211 is formed of ceramics or the like such as alumina or the like, for example.

A sealing portion 212 is provided above the base portion 211, and the sealing portion 212 is formed of the same material as the base portion 211. Also, a lid 213 is placed at the top of the sealing portion 212, such that the base portion 211, sealing portion 212, and lid 213 form a hollow box.

A package side electrode 214 is provided on the base portion 211 of the package 210 formed thus. The fixing area 111 of the base 110 of the tuning-fork type crystal vibrating piece 100 is fixed on this package side electrode 214 by an electroconductive adhesive agent or the like.

The tuning-fork type crystal vibrating piece 100 is configured as shown in FIG. 1, and accordingly the size is small and irregularities in CI values between vibrating piece devices are stabilized, so the ceramic package tuning-fork type vibrator 200 carrying this vibrating piece is also a high-performance vibrator which is small in size and wherein irregularities in CI values between vibrating piece devices are stabilized.

FIG. 9 is a schematic diagram illustrating a digital cellular telephone 300 which is a cellular telephone which is electronic equipment according to a third embodiment of the present invention.

The digital cellular telephone 300 uses the ceramic package tuning-fork type vibrator 200 according to the above-described second embodiment and the tuning-fork type crystal vibrating piece 100.

Accordingly, with regard to the configuration, operations, etc. of the ceramic package tuning-fork type vibrator 200 and the tuning-fork type crystal vibrating piece 100, the same reference numerals will be used, and the description thereof will be omitted.

FIG. 9 illustrates a circuit block of the digital cellular telephone 300, wherein, as shown in FIG. 9, in the event of transmitting with the digital cellular telephone 300, upon input by the user of his/her own voice into the microphone, the signals pass through a pulse-width modulation/encoding block and a modulator/demodulator block, and are transmitted from an antenna via a transmitter and antenna switch.

On the other hand, signals transmitted from a telephone of another party are received with the antenna, pass through the antenna switch and reception filter, and are input from the receiver to the modulator/demodulator block. Then, the modulated or demodulated signals pass through the pulse-width modulation/encoding block and are output from the speaker as voice.

Of these, a controller for controlling the antenna switch, modulator/demodulator block, etc., is provided.

In addition to the above-described, this controller also controls LCDs which are the display unit, keys which are the input unit for numerals and the like, and further RAM and ROM and the like as will and according high precision is demanded thereof. Also, there are demands for miniaturization of the digital cellular telephone 300.

The above-described ceramic package tuning-fork type vibrator 200 is used as an item meeting such demands.

This ceramic package tuning-fork type vibrator 200 has the tuning-fork type crystal vibrating piece 100 shown in FIG. 1, and accordingly irregularities in CI values between vibrating piece devices are stabilized and precision is high, and also size is reduced. Accordingly, the digital cellular telephone 300 carrying the ceramic package tuning-fork type vibrator 200 also is a high-performance digital cellular telephone wherein irregularities in CI values between vibrating piece devices are stabilized.

FIG. 10 is a diagram illustrating a tuning-fork crystal oscillator 400 which is an oscillator according to a fourth embodiment of the present invention.

The digital tuning-fork crystal oscillator 400 has many configurations in common with the ceramic package tuning-fork type vibrator 200 according to the above-described second embodiment. Accordingly, with regard to the configuration, operations, etc. of the ceramic package tuning-fork type vibrator 200 and the tuning-fork type crystal vibrating piece 100, the same reference numerals will be used, and the description thereof will be omitted.

The tuning-fork crystal oscillator 400 shown in FIG. 10 is an arrangement wherein an integrated circuit 410 is disposed on the base portion 211 below the tuning-fork type crystal vibrating piece 100 of the ceramic package tuning-fork type vibrator 200 shown in FIG. 8 as shown in FIG. 10.

That is to say, with the tuning-fork crystal oscillator 400, upon the tuning-fork type crystal vibrating piece 100 placed therein vibrating, the vibrations are input to the integrated circuit 410, following which predetermined frequency signals are extracted, thereby functioning as an oscillator.

That is, the tuning-fork type crystal vibrating piece 100 stored within the tuning-fork crystal oscillator 400 is configured as shown in FIG. 1, the size is small and irregularities in CI values between vibrating piece devices are stabilized, so the digital tuning-fork crystal oscillator 400 carrying this vibrating piece is also a high-performance oscillator, small in size, and wherein irregularities in CI values between vibrating piece devices are stabilized.

FIG. 11 is a diagram illustrating a cylinder type tuning-fork vibrator 500 which is a vibrator according to a fifth embodiment of the present invention.

This cylinder type tuning-fork vibrator 500 uses the tuning-fork type crystal vibrating piece 100 according to the first embodiment. Accordingly, with regard to the configuration, operations, etc. of the tuning-fork type crystal vibrating piece 100, the same reference numerals will be used, and the description thereof will be omitted.

FIG. 11 is a schematic diagram illustrating the configuration of the cylinder type tuning-fork vibrator 500.

As shown in FIG. 11, the cylinder type tuning-fork vibrator 500 has a metal cap 530 for storing the tuning-fork type crystal vibrating piece 100 therein. This cap 530 is pressed in with regard to a stem 520, and the interior thereof is maintained in a vacuum state.

Also, two leads 510 are provided for holding the generally H-shaped tuning-fork type crystal vibrating piece 100 stored in the cap 530.

Applying external current or the like to the cylinder type tuning-fork vibrator 500 causes the tuning-fork arms 121 and 122 of the tuning-fork type crystal vibrating piece 100 to vibrate, thereby functioning as a vibrator.

At this time, the tuning-fork type crystal vibrating piece 100 is configured as shown in FIG. 1, so the size is small and irregularities in CI values between vibrating piece devices are stabilized, and accordingly the cylinder type tuning-fork vibrator 500 carrying this vibrating piece is also a high-performance vibrator, small in size, wherein irregularities in CI values between vibrating piece devices are stabilized.

Also, though a 32.738 KH tuning-fork type crystal vibrator has been described in the above embodiments as an example, it is clear that this can be applied to 15 KH through 155 KH tuning-fork type crystal vibrators.

Also, it is clear that the tuning-fork type crystal vibrating piece 100 according to the above embodiments is not restricted to the above-described examples, but also can be used in other electronic equipment, portable information terminals, and further televisions, video devices, so-called radio-cassette players, personal computers, and other equipment with built-in clocks, and watches.

The tuning-fork type crystal vibrating piece 100 according to the present embodiment is configured as described above, and the manufacturing method thereof will be described next.

First, a tuning-fork type crystal vibrating piece in a state of electrodes not formed thereupon shown in FIG. 13 is formed by etching or the like of a crystal substrate. Subsequently, electrodes are formed on the tuning-fork type crystal vibrating piece.

The following is a description of the process of forming the electrodes, centering on the tuning-fork arms 120 and 130. Also, the tuning-fork arms 120 and 130 are identical, so the following description will be a description regarding only the tuning-fork arm 120. FIG. 15 is a schematic flowchart illustrating the process of forming electrodes on the tuning-fork arm 120.

First, FIG. 17(a) is a schematic cross-sectional diagram along line B-B' in FIG. 14 of the tuning-fork arm 120 of the tuning-fork type crystal vibrating piece of which the external form is formed by the above etching.

As shown in FIG. 17(a), grooves 120a are formed on the front 120e and rear 120f of the tuning-fork arm 120 (groove formation process).

An electrode film 150 which is a metal film is formed by sputtering or the like on the entire vibrating piece including such a tuning-fork arm 120 and the like (metal film formation process, ST1 in FIG. 16).

FIG. 17(b) illustrates this state. The electrode film 150 shown in FIG. 17 is formed with a lower layer of Cr to a thickness of 100 Å to 1000 Å for example. An upper layer of Au is formed to a thickness of 500 Å to 1000 Å for example.

Thus, following forming the electrode film 150 on the entire surface, fogging of photo-resist is performed as a fog so as to coat the entire face of the electrode film 150, as indicated in ST2 in FIG. 16. That is, a photo-resist film 151 is formed as shown in FIG. 17(c) (photo-resist layer formation process).

This photo-resist is a compound based on a resin having photosensitivity to ultraviolet rays, and has fluidity, and accordingly is coated by fogging as a fog by spraying, for example.

Also, the thickness of the photo-resist film 151 is 1 μm to 6 μm, for example.

Next, photo-resist pattern formation is performed as shown in ST3 of FIG. 16. That is, ultraviolet rays are irradiated on the photo-resist film 151 via an unshown mask covering portions except for the electrode formation portions (hatched portions) in FIG. 14 (exposure), this is removed with a developing fluid, and the photo-resist film 151 is hardened through a heating process or the like.

Thus, a photo-resist pattern 152 corresponding to the electrode formation portion (hatched portion) in FIG. 14 is formed.

At this time, the photo-resist pattern 152 has a portion wherein the photo-resist film 151 is not formed at a short-circuit preventing width W1 shown in FIG. 14 and FIG. 15, specifically, a width of 15 μm for example.

Now, the photo-resist is coated over the electrode film 150 as described above, and there is the need to coat so as to cover the edge portion (the arrow E in the figure) which is the corner of the tuning-fork arm 120 in FIG. 17(a). At this time, the edge portion E is better covered if the photo-resist to be coated is in particles.

However, in the event of coating in the state of the photo-resist containing such particle forms, the external shape of the photo-resist pattern 152 following photo-resist developing is not accurate generally straight lines, but is formed as generally wave-shaped lines following the outer forms of the particles.

In the event that the outer shape lines of the photo-resist pattern 152 are thus not uniform, there is the possibility that the fine gap of the short-circuit preventing width W1 might not be maintained at parts.

Parts where the gap is not maintained are parts not etched, so there is the possibility of short-circuiting between electrodes.

Accordingly, with the present embodiment, laser irradiation is performed (pattern form adjusting process) as shown in ST4 of FIG. 16. Specifically, this is performed regarding the short-circuit preventing width W1 of the arm front 120e of the tuning-fork arm 120 shown in FIG. 13 which is a part of the form of the photo-resist pattern 152.

That is, as shown in FIG. 18(a), in the event that the outer shape lines of the photo-resist pattern 152 are not uniform, and etching is performed with this photo-resist pattern as a mask, the outer form of the photo-resist pattern 152 is adjusted by laser so that 15 μm for example can be secured for the short-circuit preventing width W1, so that short-circuiting and the like does not occur between the formed groove electrode 120b and the side electrode 120d.

A YAG laser or the like is used for this laser for example, and the outer form of the photo-resist pattern 152 can be adjusted more accurately by using YAG laser triple harmonics, for example.

Thus, the laser is irradiated after forming the photo-resist pattern 152, so there is no need to irradiate laser within a yellow room for preventing exposure of the photo-resist in particular, thereby enabling manufacturing costs to be reduced.

Also, laser irradiation is performed separately for the short-circuit preventing width W1 of the arm front 120e of the tuning-fork arm 120 and the short-circuit preventing width W1 of the arm rear 120f, as shown in FIGS. 18(a) and (b).

However, the present embodiment is not restricted to this, and both the arm front 120e and the arm rear 120f can be simultaneously worked by laser as shown in FIG. 18(c).

In this case, the manufacturing costs can be lowered since manufacturing processes can be reduced.

Thus, following the photo-resist pattern 152 being accurately formed by laser, the etching processing (electrode film formation process) in ST5 of FIG. 16 is performed.

Specifically, the electrode film 150 is removed by etching with the above-described photo-resist pattern 152 as a mask.

FIG. 19(a) is a diagram illustrating the state of the electrode film 150 removed by etching. As shown in FIG. 19(a), according to the manufacturing method of the present embodiment, the short-circuit preventing width W1 can be accurately secured.

Next, by removing the photo-resist pattern 152 in the resist peeling processing of ST6 in FIG. 16, the groove electrode 120b and side electrode 120d are formed accurately as shown in FIG. 19(b) (photo-resist pattern peeling process).

At this time, a part of the electrode film 150 is melted by the laser irradiation illustrated in FIG. 18 in the above-described laser irradiation process (ST3), and a part of the melted electrode film 150 is removed along with the resist pattern 152 so the short-circuit preventing width W1 can be formed in a more accurate manner.

Then, at this time, with regard to the entire tuning-fork type crystal vibrating piece 100, a base electrode 14a or the like is formed of a predetermined form as shown in FIG. 14, thereby completing the electrode placement on the tuning-fork type crystal vibrating piece 100.

With the tuning-fork type crystal vibrating piece 100 thus manufactured, the short-circuit preventing width W1 is accurately maintained at 15 μm for example for the arm front 120e and 130e and the arm rear 120f and 130f for the tuning-fork arms 120 and 130, and short-circuiting between the groove electrodes 120b and 130b, and 120d and 130d can be effectively prevented, thus yielding a tuning-fork type crystal vibrating piece wherein defects do not readily occur.

As described above, according to the present invention, a vibrating piece wherein irregularities in CI values between vibrating piece devices are stabilized even in the event of shortening the base while miniaturizing the entire vibrating piece, a vibrator having this, and an oscillator and electronic equipment having this vibrator, can be provided.

The entire disclosure of Japanese Patent Application No. 2000-392934 filed Dec. 25, 2000 is incorporated by reference herein.

What is claimed is:
1. A vibrating piece comprising:
a base; and
vibrating arms formed protruding from said base;
wherein a groove is formed on at least one of a front side and a rear side of said vibrating arms, and wherein notches are formed in said base.
2. A vibrating piece according to claim 1, wherein said base comprises a fixing area fixing said vibrating piece, and wherein said notches are provided between said fixing area and said vibrating arms.
3. A vibrating piece according to claim 1, wherein said vibrating piece is a tuning-fork oscillating piece formed of a crystal which oscillates at around 30 KHz to 40 KHz.
4. A vibrating piece comprising:
a base; and
vibrating arms protruding from said base;
wherein a groove is formed on at least one of a front side and a rear side of said vibrating arms and notches are formed in said base, and wherein said vibrating arms are generally parallelepipeds, the width of the arm portion which is a short side of the front side thereof being between about 50 μm and about 150 μm.
5. A vibrating piece comprising:
a base; and
vibrating arms protruding from said base;
wherein a groove is formed on both of a front side and a rear side of said vibrating arms, and wherein a depth of a groove formed on either the front side or the rear side is between 30% and 50% of the thickness of said vibrating arm which is the full length thereof in the depth direction.
6. A vibrating piece comprising:
a base; and
vibrating arms protruding from said base;
wherein a groove is formed on both of a front side and a rear side of said vibrating arms, and wherein a depth of a groove formed on either the front side or the rear side is between 40% and 50% of the thickness of said vibrating arm which is the full length thereof in the depth direction.
7. A vibrating piece comprising:
a base; and
vibrating arms protruding from said base;
wherein a groove is formed on both of a front side and a rear side of said vibrating arms, and wherein a depth of a groove formed on either the front side or the rear side is between 30% and 50% of the thickness of said vibrating arm which is the full length thereof in the depth direction, and wherein a groove width which is a short side of an opening of said groove is 40% or more of said width of said vibrating arm.
8. A vibrating piece comprising:
a base; and
vibrating arms protruding from said base;
wherein a groove is formed on both of a front side and a rear side of said vibrating arms, and wherein a depth of a groove formed on either the front side or rear side is between 30% and 50% of the thickness of said vibrating arm which is the full length thereof in the depth direction, and wherein a groove width which is a short side of an opening of said groove is between 70% and 100% of said width of said vibrating arm.
9. A vibrator comprising:
a vibrating piece having a base and vibrating arms protruding from said base, said vibrator stored in a package;
wherein a groove is formed on at least one of a front side and a rear side of said vibrating arms of said vibrating piece, and wherein notches are formed in said base.
10. A vibrator according to claim 9, wherein said base of said vibrating piece comprises a fixing area fixing said vibrating piece, and wherein said notches are provided between said fixing area and said vibrating arms.
11. A vibrator according to claim 9, wherein said vibrating piece is a tuning-fork oscillating piece formed of a crystal which oscillates at around 30 KHz to 40 KHz.
12. A vibrator according to claim 9, wherein said package is in a box form.
13. A vibrator according to claim 9, wherein said package is formed as a cylinder type package.
14. A vibrator comprising:
a vibrating piece having a base and vibrating arms protruding from said base, said vibrator stored in a package;
wherein a groove is formed on at least one of a front side and a rear side of said vibrating arms and notches are formed in said base, and wherein said vibrating arms are generally parallelepipeds, a width of the arm portion which is the short side of the front side thereof being between about 50 μm and about 150 μm.

15. A vibrator comprising:

a vibrating piece having a base and vibrating arms protruding from said base, said vibrator stored in a package;

wherein a groove is formed on both of a front side and a rear side of said vibrating arms, and wherein a depth of a groove formed on either the front side or the rear side is between 30% and 50% of the thickness of said vibrating arm which is the full length thereof in the depth direction.

16. A vibrator comprising:

a vibrating piece having a base and vibrating arms protruding from said base, said vibrator stored in a package;

wherein a groove is formed on both of a front side and a rear side of said vibrating arms, and wherein a depth of a groove formed on either the front side or the rear side is between 40% and 50% of the thickness of said vibrating arm which is the full length thereof in the depth direction.

17. A vibrator comprising:

a vibrating piece having a base and vibrating arms protruding from said base, said vibrator stored in a package;

wherein a groove is formed on both of a front side and a rear side of said vibrating arms, and wherein a depth of a groove formed on either the front side or the rear side is between 30% and 50% of the thickness of said vibrating arm which is the full length thereof in the depth direction, and wherein a groove width which is a short side of an opening of said groove is 40% or more of said width of said vibrating arm.

18. A vibrator comprising:

a vibrating piece having a base and vibrating arms formed protruding from said base, said vibrator stored in a package;

wherein a groove is formed on both of a front side and a rear side of said vibrating arms, and wherein a depth of a groove formed on either the front side or the rear side is between 30% and 50% of the thickness of said vibrating arm which is the full length thereof in the depth direction, and wherein a groove width which is a short side of an opening of said groove is between 70% and 100% of said width of said vibrating arm.

19. An oscillator comprising:

a vibrating piece having a base and vibrating arms protruding from said base; and an integrated circuit;

said vibrating piece and integrated circuit stored in a package;

wherein a groove is formed on at least one of a front side and a rear side of said vibrating arms of said vibrating piece, and wherein notches are formed in said base.

20. Electronic equipment including a vibrator connected to a control unit so as to use said vibrator, said vibrator comprising:

a vibrating piece having a base and vibrating arms protruding from said base, said vibrating piece stored in a package;

wherein a groove is formed on at least one of a front side and a rear side of said vibrating arms of said vibrating piece, and wherein notches are formed in said base.

* * * * *

UNITED STATES PATENT AND TRADEMARK OFFICE
CERTIFICATE OF CORRECTION

PATENT NO. : 6,587,009 B2  Page 1 of 1
DATED : July 1, 2003
INVENTOR(S) : Kitamura et al.

It is certified that error appears in the above-identified patent and that said Letters Patent is hereby corrected as shown below:

Column 1,
Line 55, "fW/L$^2$" should be -- $f \propto W/L^2$ --;
Line 56, "short that" should be -- shorter --;

Column 3,
Line 5, "DRAWING" should be -- DRAWINGS --;

Column 7,
Line 35, "f W/L$^2$" should be -- $f \propto W/L^2$ --;

Column 10,
Line 8, "will" should be -- well --;
Line 8, "according" should be -- accordingly --;

Column 13,
Line 62, "parallelepipeds" should be -- parallelepiped --;

Column 14,
Line 65, "parallelepipeds" should be -- parallelepiped --.

Signed and Sealed this

Third Day of February, 2004

JON W. DUDAS
*Acting Director of the United States Patent and Trademark Office*